(12) United States Patent
Azuma et al.

(10) Patent No.: US 12,127,336 B2
(45) Date of Patent: Oct. 22, 2024

(54) WIRING CIRCUIT BOARD

(71) Applicant: NITTO DENKO CORPORATION, Osaka (JP)

(72) Inventors: Takahito Azuma, Osaka (JP); Yoshito Fujimura, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 16 days.

(21) Appl. No.: 17/802,421

(22) PCT Filed: Dec. 18, 2020

(86) PCT No.: PCT/JP2020/047477
§ 371 (c)(1),
(2) Date: Aug. 25, 2022

(87) PCT Pub. No.: WO2021/176803
PCT Pub. Date: Sep. 10, 2021

(65) Prior Publication Data
US 2023/0094708 A1 Mar. 30, 2023

(30) Foreign Application Priority Data
Mar. 3, 2020 (JP) .................. 2020-035856

(51) Int. Cl.
*H05K 1/02* (2006.01)
(52) U.S. Cl.
CPC ................. *H05K 1/0271* (2013.01)
(58) Field of Classification Search
CPC ............... H05K 1/02; H05K 1/0271
(Continued)

(56) References Cited

U.S. PATENT DOCUMENTS

| 6,353,515 B1 | 3/2002 | Heim |
| 8,488,281 B1 | 7/2013 | Pan |

(Continued)

FOREIGN PATENT DOCUMENTS

| JP | H11-317130 A | 11/1999 |
| JP | 2007-043129 A | 2/2007 |

(Continued)

OTHER PUBLICATIONS

International Search Report issued in PCT/JP2020/047477 on Mar. 9, 2021.

(Continued)

*Primary Examiner* — Tremesha S Willis
(74) *Attorney, Agent, or Firm* — Edwards Neils LLC; Jean C. Edwards, Esq.

(57) ABSTRACT

A suspension board with circuit extending in a predetermined direction includes a base insulating layer, and a conductive layer disposed on one side in a thickness direction of the base insulating layer. The base insulating layer includes a first body base and a second body base disposed spaced apart from each other in a width direction, and a connection portion connecting a portion of the first body base in the longitudinal direction to a portion of the second body base in the longitudinal direction. The suspension board with circuit further includes a reinforcing portion disposed on the surface of the connection portion and reinforcing the connection portion. The reinforcing portion includes two or more resin layers laminated in the thickness direction, or a metal member.

4 Claims, 10 Drawing Sheets

(58) Field of Classification Search
USPC .......................................................... 174/261
See application file for complete search history.

(56) References Cited

U.S. PATENT DOCUMENTS

| | | |
|---|---|---|
| 9,064,513 B1 | 6/2015 | Pan et al. |
| 9,721,714 B1 | 8/2017 | Sun et al. |
| 2007/0019076 A1 | 1/2007 | Teramoto et al. |
| 2009/0268347 A1 | 10/2009 | Muraki et al. |
| 2011/0234505 A1 | 9/2011 | Kim et al. |
| 2017/0194076 A1 | 7/2017 | Yosui et al. |
| 2019/0198195 A1 | 6/2019 | Yosui et al. |

FOREIGN PATENT DOCUMENTS

| | | |
|---|---|---|
| JP | 2009-259362 A | 11/2009 |
| JP | 2011-210224 A | 10/2011 |
| JP | 2016-111029 A | 6/2016 |
| JP | 2017-212422 A | 11/2017 |
| WO | 2016/056496 A1 | 4/2016 |

OTHER PUBLICATIONS

Written Opinion issued in PCT/JP2020/047477 on Mar. 9, 2021.
International Preliminary Report on Patentability issued by WIPO on Sep. 6, 2022, in connection with International Patent Application No. PCT/JP2020/047477.
Office Action, issued by the Japanese Patent Office on Feb. 20, 2024, in connection with Japanese Patent Application No. 2020-035856.
Office Action, issued by the Japanese Patent Office on Aug. 6, 2024, in connection with Japanese Patent Application No. 2020-035856.

WIRING CIRCUIT BOARD

CROSS-REFERENCE TO RELATED APPLICATIONS

The present application is a 35 U.S.C. 371 National Stage Entry of for PCT/JP2020/047477, filed on Dec. 18, 2020, which claims priority from Japanese Patent Application No. 2020-035856, filed on Mar. 3, 2020, the contents of all of which are herein incorporated by reference in their entirety.

TECHNICAL FIELD

The present invention relates to a wiring circuit board.

BACKGROUND ART

The wiring circuit board is used for various industrial products such as electronic and electrical devices. As such a wiring circuit board, for example, a flexible printed wiring board, a flexible printed wiring board with a reinforcing layer including a reinforcing layer, and a suspension board with circuit including a suspension (spring) layer have been known.

For example, a suspension including a metal layer, a dielectric layer, and a copper layer constituting a transmission wiring in order in a thickness direction of the metal layer, and in which the dielectric layer is laminated on the metal layer in accordance with the transmission wiring of the copper layer to be patterned has been proposed (ref: for example, Patent Document 1).

Such a dielectric layer has a pattern corresponding to the transmission wiring and has portions disposed spaced apart from each other in a width direction perpendicular to a longitudinal direction of the suspension.

CITATION LIST

Patent Document

Patent Document 1: Japanese Unexamined Patent Publication No. 2009-259362

SUMMARY OF THE INVENTION

Problem to be Solved by the Invention

However, when the suspension described in Patent Document 1 is used, load stress acts on the suspension, and the suspension may be deformed. In this case, it is desired to control the deformation of the suspension.

Therefore, in the dielectric layer provided in the suspension described in Patent Document 1, it is considered that a connection portion connecting the portions which are disposed spaced apart from each other in the width direction is provided.

However, even when the connection portion is provided in the dielectric layer, there is a problem that the connection portion may be damaged due to the load stress acting on the suspension, and the deformation of the suspension cannot be stably controlled.

The present invention provides a wiring circuit board which is capable of reinforcing a connection portion, and stably controlling deformation of the wiring circuit board.

Means for Solving the Problem

The present invention [1] includes a wiring circuit board extending in a predetermined direction including an insulating layer, and a conductive layer disposed on one side in a thickness direction of the insulating layer, wherein the insulating layer includes a first portion and a second portion disposed spaced apart from each other in a width direction perpendicular to a longitudinal direction of the wiring circuit board, and a connection portion connecting a portion of the first portion in the longitudinal direction to a portion of the second portion in the longitudinal direction; the wiring circuit board includes a reinforcing portion disposed on the surface of the connection portion and reinforcing the connection portion; and the reinforcing portion includes two or more resin layers laminated in the thickness direction, or a metal member.

According to such a configuration, the insulating layer includes the connection portion connecting a portion of the first portion in the longitudinal direction to a portion of the second portion in the longitudinal direction, and the reinforcing portion is disposed on the surface of the connection portion. Then, the reinforcing portion includes the two or more resin layers laminated in the thickness direction, and/or the metal member. Therefore, it is possible to sufficiently reinforce the connection portion.

As a result, when load stress acts on the wiring circuit board, it is possible to suppress damage to the connection portion, and stably control deformation of the wiring circuit board.

The present invention [2] includes the wiring circuit board described in the above-described [1], wherein the reinforcing portion includes the metal member, and the metal member is made of the same metal as the conductive layer.

According to such a configuration, since the reinforcing portion includes the metal member, it is possible to reliably reinforce the connection portion. Further, since the metal member is made of the same metal as the conductive layer, in the production of the wiring circuit board, it is possible to form the conductive layer and the metal member at the same time.

The present invention [3] includes the wiring circuit board described in the above-described [2], wherein the conductive layer includes a wiring, and the wiring includes the metal member.

According to such a configuration, since the wiring includes the metal member, it is possible to reduce the number of components as compared with an embodiment including the wiring and the metal member separately. Further, it is possible to collectively inspect formation failure of the wiring and the metal member by conduction inspection of the conductive layer.

The present invention [4] includes the wiring circuit board described in the above-described [3], wherein the conductive layer includes a first terminal, and a second terminal located away from the first terminal in the longitudinal direction, and the wiring includes a wiring body connecting the first terminal to the second terminal, and the metal member continuous with the wiring body.

According to such a configuration, it is possible to dispose the metal member continuous with the wiring body on the connection portion, while ensuring efficient routing of the wiring body connecting the first terminal to the second terminal.

Effect of the Invention

According to the wiring circuit board of the present invention, it is possible to reinforce a connection portion, and stably control deformation of the wiring circuit board.

DESCRIPTION OF EMBODIMENTS

A suspension board with circuit 1 as one embodiment of a wiring circuit board of the present invention is described with reference to FIGS. 1 to 4.

Figure 1:
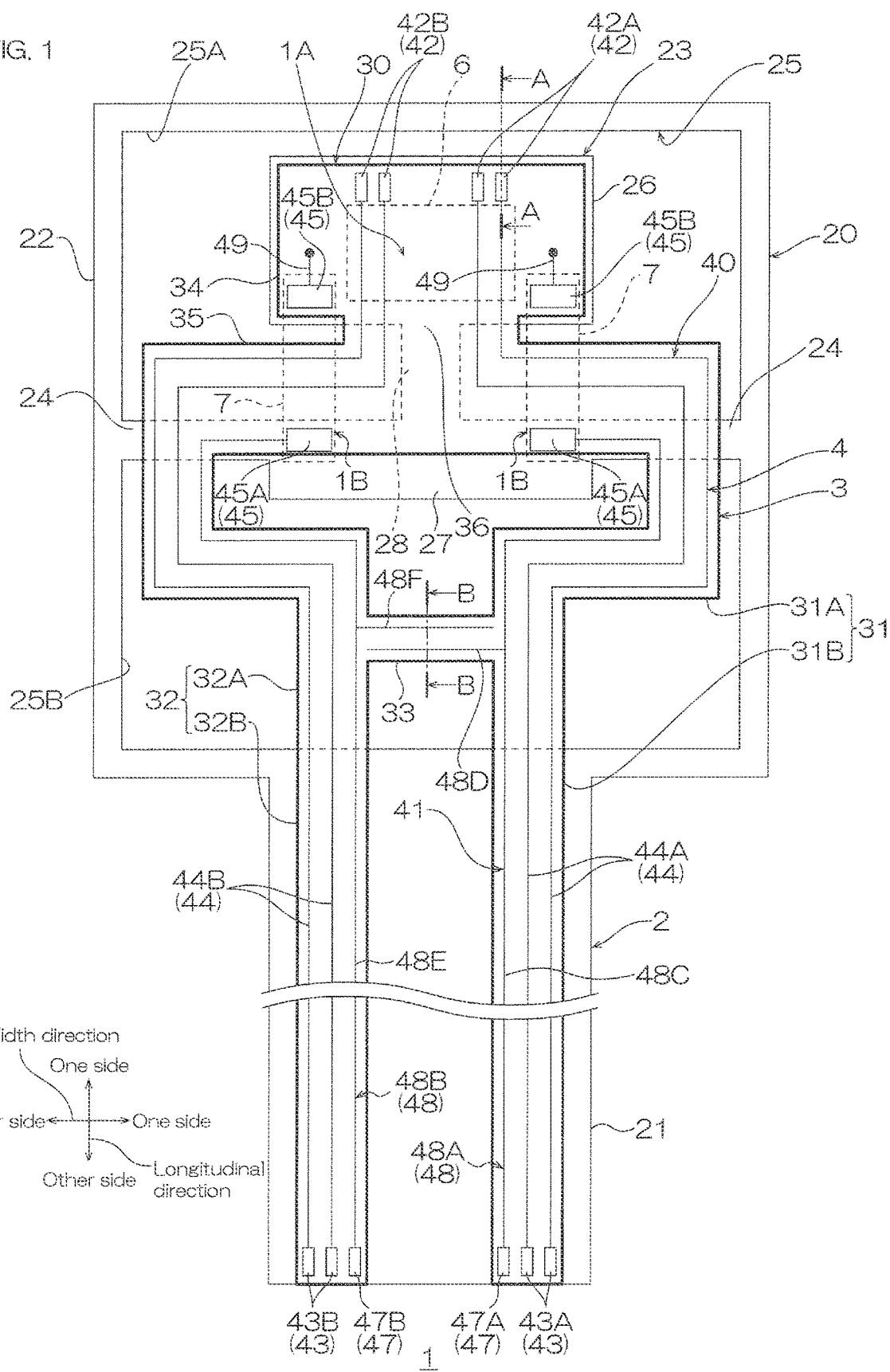
FIG. 1 shows a plan view of a suspension board with circuit as one embodiment of a wiring circuit board of the present invention.

As shown in FIG. 1, the suspension board with circuit 1 has a generally flat belt shape extending in a predetermined direction.

In FIG. 1, a thickness direction on the plane of the sheet is a thickness direction (first direction) of the suspension board with circuit 1, a near side on the plane of the sheet is one side in the thickness direction (one side in the first direction), and a depth side on the plane of the sheet is the other side in the thickness direction (other side in the first direction).

In FIG. 1, an up-down direction on the plane of the sheet is a longitudinal direction (second direction perpendicular to the first direction) of the suspension board with circuit 1, an upper side on the plane of the sheet is one side in the longitudinal direction (one side in the second direction), and a lower side on the plane of the sheet is the other side in the longitudinal direction (the other side in the second direction).

In FIG. 1, a right-left direction on the plane of the sheet is a width direction (third direction perpendicular to the first direction and the second direction) of the suspension board with circuit 1, a right side on the plane of the sheet is one side in the width direction (one side in the third direction), and a left side on the plane of the sheet is the other side in the width direction (the other side in the third direction). Specifically, directions are in conformity with direction arrows described in each view.

Further, in the following, the thickness direction of the suspension board with circuit 1 is simply referred to as the thickness direction, the longitudinal direction thereof is simply referred to as the longitudinal direction, and the width direction thereof is simply referred to as the width direction unless otherwise specified. The longitudinal direction is perpendicular to the thickness direction, and the width direction is perpendicular to both directions of the longitudinal direction and the thickness direction.

The suspension board with circuit 1 is capable of mounting a slider 6 and a plurality of piezoelectric elements 7. Although not shown, the slider 6 has a magnetic head. The piezoelectric element 7 is an actuator capable of extending and contracting in the longitudinal direction, and by supplying electricity and controlling its voltage, it extends and contracts. The number of the piezoelectric elements 7 is not particularly limited, and in the present embodiment, the number is two.

The suspension board with circuit 1 includes a first mounting region 1A and a plurality of second mounting regions 1B.

The first mounting region 1A is a region for mounting the slider 6. The first mounting region 1A is located in one end portion of the suspension board with circuit 1 in the longitudinal direction. The first mounting region 1A is located between the plurality of second mounting regions 1B in the width direction.

The plurality of second mounting regions 1B are regions for mounting the piezoelectric element 7. The plurality of second mounting regions 1B are located spaced apart from each other in the width direction.

Figure 2:
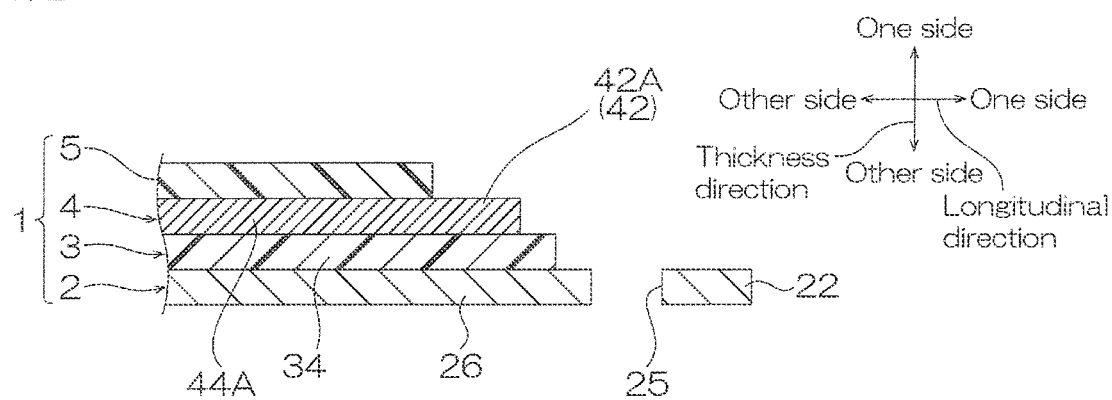
FIG. 2 shows an A-A cross-sectional view of the suspension board with circuit shown in FIG. 1.

As shown in FIG. 2, the suspension board with circuit 1 includes a metal supporting layer 2, a base insulating layer 3 as one example of an insulating layer, a conductive layer 4, and a cover insulating layer 5 in order from the other side toward one side in the thickness direction.

1-1. Metal Supporting Layer

As shown in FIG. 1, the metal supporting layer 2 is a metal support supporting the conductive layer 4, and extends in the longitudinal direction. In FIG. 1, for convenience, the metal supporting layer 2 is shown by a solid line and a broken line, the base insulating layer 3 is shown by a thick line, the conductive layer 4 is shown by the solid line, and the cover insulating layer 5 is omitted.

The metal supporting layer 2 includes a gimbal portion 20 and a body portion 21.

The gimbal portion 20 is located in one end portion of the metal supporting layer 2 in the longitudinal direction. The gimbal portion 20 includes a frame portion 22, a stage 23, and a plurality of stage connection portions 24.

The frame portion 22 has a rectangular frame shape when viewed in the thickness direction, and defines an opening 25. The frame portion 22 surrounds the stage 23.

The stage 23 is disposed spaced apart from the frame portion 22 in the opening 25. The stage 23 has an H-shape when viewed in the thickness direction. The stage 23 includes a first stage 26, a second stage 27, and a stage connection portion 28.

The first stage 26 is located in one end portion of the stage 23 in the longitudinal direction. The first stage 26 has a rectangular shape extending in the width direction when viewed in the thickness direction.

The second stage 27 is located in the other end portion of the stage 23 in the longitudinal direction. The second stage 27 is located spaced apart from the first stage 26 at the other side in the longitudinal direction. The second stage 27 has a rectangular shape extending in the width direction when viewed in the thickness direction.

The stage connection portion 28 is located between the first stage 26 and the second stage 27 in the longitudinal direction. The stage connection portion 28 connects a central portion in the width direction of the other end edge of the first stage 26 in the longitudinal direction to the central portion in the width direction of one end edge of the second stage 27 in the longitudinal direction.

The plurality of stage connection portions 24 connect the second stage 27 to the frame portion 22. The plurality of stage connection portions 24 are, specifically, the two stage connection portions 24. The two stage connection portions 24 are located spaced apart from each other in the width direction. Of the two stage connection portions 24, the stage connection portion 24 located at one side in the width direction extends in the longitudinal direction continuously from one end portion of the second stage 27 in the width direction, and is connected to the frame portion 22. Of the two stage connection portions 24, the stage connection portion 24 located at the other side in the width direction extends in the longitudinal direction continuously from the other end portion of the second stage 27 in the width direction, and is connected to the frame portion 22.

Then, the second stage 27 and the two stage connection portions 24 divides the opening 25 into a first opening 25A and a second opening 25B.

The first opening 25A is located at one side with respect to the second stage 27 in the longitudinal direction. The first opening 25A is defined by one end edge of the second stage 27 in the longitudinal direction, one end edges of the two stage connection portions 24 in the longitudinal direction, and an inner end edge of the frame portion 22. The first stage 26 and the stage connection portion 28 are located in the first opening 25A.

The second opening 25B is located at the other side with respect to the second stage 27 in the longitudinal direction. The second opening 25B is defined by the other end edge of the second stage 27 in the longitudinal direction, the other end edges of the two stage connection portions 24 in the longitudinal direction, and the inner end edge of the frame portion 22.

The body portion 21 is a portion supported by a load beam (not shown). The body portion 21 is located at the other side with respect to the gimbal portion 20 in the longitudinal direction. The body portion 21 has a flat belt shape extending in the longitudinal direction. The body portion 21 is continuous with the other end portion of the frame portion 22 in the longitudinal direction.

Examples of a material for the metal supporting layer 2 include metal materials such as stainless steel. A thickness of the metal supporting layer 2 is not particularly limited, and is, for example, 10 μm or more and 35 μm or less.

1-2. Base Insulating Layer

As shown in FIG. 2, the base insulating layer 3 is disposed on one side of the metal supporting layer 2 in the thickness direction, specifically, on one surface in the thickness direction of the metal supporting layer 2. The base insulating layer 3 has a predetermined pattern corresponding to the conductive layer 4. The base insulating layer 3 is located between the metal supporting layer 2 and the conductive layer 4 in the thickness direction.

As shown in FIG. 1, the base insulating layer 3 includes a stage base 30, a first body base 31 as one example of a first portion, a second body base 32 as one example of a second portion, and a connection portion 33.

The stage base 30 is located on the stage 23. The stage base 30 includes a first stage base 34, a second stage base 35, and a stage base connection portion 36.

The first stage base 34 is located on the first stage 26. The first stage base 34 has a rectangular shape extending in the width direction when viewed in the thickness direction.

The second stage base 35 is located spaced apart from the first stage base 34 at the other side in the longitudinal direction. The second stage base 35 has a rectangular shape extending in the width direction when viewed in the thickness direction. When viewed in the thickness direction, the second stage base 35 is collectively overlapped with the stage connection portion 28, a one-side portion of the second stage 27 in the longitudinal direction, and the two stage connection portions 24.

The stage base connection portion 36 is located between the first stage base 34 and the second stage base 35 in the longitudinal direction. The stage base connection portion 36 connects the central portion in the width direction of the other end edge of the first stage base 34 in the longitudinal direction to the central portion in the width direction of one end edge of the second stage base 35 in the longitudinal direction.

The first body base 31 and the second body base 32 are located at the other side with respect to the second stage base 35 in the longitudinal direction. The first body base 31 and the second body base 32 are disposed spaced apart from each other in the width direction.

The first body base 31 is located at one side with respect to the second body base 32 in the width direction. The first body base 31 has a flat belt shape extending in the longitudinal direction. The first body base 31 has a first non-supported portion 31A and a first supported portion 31B.

The first non-supported portion 31A is located in one end portion of the first body base 31 in the longitudinal direction. The first non-supported portion 31A is overlapped with the second opening 25B when viewed in the thickness direction. Therefore, the first non-supported portion 31A is not supported by the metal supporting layer 2. The first non-supported portion 31A has a crank-shape when viewed in the thickness direction. Specifically, the first non-supported portion 31A extends toward the other side in the longitudinal direction continuously from one end portion of the second stage base 35 in the width direction, thereafter, is bent toward the other side in the width direction, and next, is bent toward the other side in the longitudinal direction.

The first supported portion 31B is located at the other side of the first non-supported portion 31A in the longitudinal direction. The first supported portion 31B is overlapped with the body portion 21 when viewed in the thickness direction. The first supported portion 31B is located on the body portion 21. Therefore, the first supported portion 31B is supported by the body portion 21. The first supported portion 31B extends along the longitudinal direction. One end portion of the first supported portion 31B in the longitudinal direction is connected to the other end portion of the first non-supported portion 31A in the longitudinal direction.

The second body base 32 has a flat belt shape extending in the longitudinal direction. The second body base 32 has a second non-supported portion 32A and a second supported portion 32B.

The second non-supported portion 32A is located in one end portion of the second body base 32 in the longitudinal direction. The second non-supported portion 32A is overlapped with the second opening 25B when viewed in the thickness direction. Therefore, the second non-supported portion 32A is not supported by the metal supporting layer 2. The second non-supported portion 32A is located spaced apart from the first non-supported portion 31A at the other side in the width direction. The second non-supported portion 32A has a crank-shape when viewed in the thickness direction. Specifically, the second non-supported portion 32A extends toward the other side in the longitudinal direction continuously from the other end portion of the second stage base 35 in the width direction, thereafter, is bent toward one side in the width direction, and next, is bent toward the other side in the longitudinal direction.

The second supported portion 32B is located at the other side of the second non-supported portion 32A in the longitudinal direction. The second supported portion 32B is overlapped with the body portion 21 when viewed in the thickness direction. The second supported portion 32B is located on the body portion 21. Therefore, the second supported portion 32B is supported by the body portion 21. The second supported portion 32B is located spaced apart from the first supported portion 31B at the other side in the width direction. The second supported portion 32B extends along the longitudinal direction. One end portion of the second supported portion 32B in the longitudinal direction is connected to the other end portion of the second non-supported portion 32A in the longitudinal direction.

The connection portion 33 connects a portion of the first body base 31 in the longitudinal direction to a portion of the second body base 32 in the longitudinal direction. More specifically, the connection portion 33 connects a portion of the first non-supported portion 31A to a portion of the second non-supported portion 32A. The connection portion 33 is located between the first non-supported portion 31A and the second non-supported portion 32A. The connection portion 33 is overlapped with the second opening 25B when viewed in the thickness direction. The connection portion 33 has a rectangular shape extending in the width direction when viewed in the thickness direction. The connection portion 33, the first non-supported portion 31A continuous with the connection portion 33, and the second non-supported portion 32A continuous with the connection portion 33 have an H-shape when viewed in the thickness direction. In the present embodiment, the connection portion 33 is shorter than the first non-supported portion 31A and the second non-supported portion 32A in the longitudinal direction. The connection portion 33 may be longer than the first non-supported portion 31A and the second non-supported portion 32A in the longitudinal direction.

Examples of a material for the base insulating layer 3 include synthetic resins such as polyimide resins.

A thickness of the base insulating layer 3 is not particularly limited, and is, for example, 1 µm or more and 1000 µm or less.

1-3. Conductive Layer

As shown in FIG. 2, the conductive layer 4 is disposed on one side of the base insulating layer 3 in the thickness direction, specifically, on one surface in the thickness direction of the base insulating layer 3.

As shown in FIG. 1, the conductive layer 4 includes a first wiring pattern 40 and a second wiring pattern 41.

The first wiring pattern 40 includes a plurality of slider connection terminals 42, a plurality of external connection terminals 43, and a plurality of signal wirings 44.

The plurality of slider connection terminals 42 are electrically connected to the slider 6 through a bonding material (for example, solder etc.) when the slider 6 is mounted on the suspension board with circuit 1.

The plurality of slider connection terminals 42 are located in one end portion of the suspension board with circuit 1 in the longitudinal direction. The plurality of slider connection terminals 42 are, specifically, the four slider connection terminals 42. Alhough in the present embodiment, the number of the slider connection terminals 42 is four for convenience, it is not particularly limited.

The plurality of slider connection terminals 42 are disposed on the first stage base 34. In the present embodiment, the plurality of slider connection terminals 42 are disposed adjacent to the first mounting region 1A. More specifically, the plurality of slider connection terminals 42 are disposed adjacent to one side with respect to the first mounting region 1A in the longitudinal direction. The plurality of slider connection terminals 42 may be disposed inside the first mounting region 1A.

The plurality of slider connection terminals 42 are located spaced apart from each other in the width direction. The plurality of slider connection terminals 42 include a plurality of first slider connection terminals 42A and a plurality of second slider connection terminals 42B. The plurality of first slider connection terminals 42A and the plurality of second slider connection terminals 42B are located spaced apart from each other in the width direction. The plurality of first slider connection terminals 42A are, specifically, the two first slider connection terminals 42A. The plurality of second slider connection terminals 42B are, specifically, the two second slider connection terminals 42B. Although in the present embodiment, each number of the first slider connection terminals 42A and the second slider connection terminals 42B is two for convenience, it is not particularly limited. The plurality of first slider connection terminals 42A are located at one side in the width direction, and the plurality of second slider connection terminals 42B are located at the other side in the width direction.

The plurality of external connection terminals 43 are electrically connected to an external board which is not shown in a state where the body portion 21 is supported by a load beam (not shown).

The plurality of external connection terminals 43 are located in the other end portion of the suspension board with circuit 1 in the longitudinal direction. The same number of the external connection terminals 43 is provided as the plurality of slider connection terminals 42. The plurality of external connection terminals 43 include a plurality of first external connection terminals 43A and a plurality of second external connection terminals 43B. The plurality of first external connection terminals 43A and the plurality of second external connection terminals 43B are located spaced apart from each other in the width direction. The same number of the first external connection terminals 43A is provided as the first slider connection terminals 42A. The same number of the second external connection terminals 43B is provided as the second slider connection terminals 42B. The plurality of first external connection terminals 43A are located at one side in the width direction, and the plurality of second external connection terminals 43B are located at the other side in the width direction. The plurality of first external connection terminals 43A are disposed on the other end portion of the first supported portion 31B in the longitudinal direction. The plurality of second external connection terminals 43B are disposed on the other end portion of the second supported portion 32B in the longitudinal direction.

The plurality of signal wirings 44 electrically connect the plurality of slider connection terminals 42 to the plurality of external connection terminals 43. The plurality of signal wirings 44 include a plurality of first signal wirings 44A and a plurality of second signal wirings 44B. The plurality of first signal wirings 44A and the plurality of second signal wirings 44B are disposed spaced apart from each other in the width direction. The plurality of first signal wirings 44A are located at one side in the width direction, and the plurality of second signal wirings 44B are located at the other side in the width direction.

The plurality of first signal wirings 44A electrically connect the plurality of first slider connection terminals 42A to the plurality of first external connection terminals 43A. The plurality of first signal wirings 44A extend in the longitudinal direction, and are located spaced apart from each other in the width direction. The first signal wiring 44A passes on the first stage base 34, on the second stage base 35, and on the first body base 31 in order continuously from the first slider connection terminal 42A, and is connected to the first external connection terminal 43A.

The plurality of second signal wirings 44B electrically connect the plurality of second slider connection terminals 42B to the plurality of second external connection terminals 43B. The plurality of second signal wirings 44B extend in the longitudinal direction, and are located spaced apart from each other in the width direction. The second signal wiring 44B passes on the first stage base 34, on the second stage base 35, and on the second body base 32 in order continuously from the second slider connection terminal 42B, and is connected to the second external connection terminal 43B.

The second wiring pattern 41 includes a plurality of element connection terminals 45, a plurality of power supply terminals 47 as one example of a second terminal, a plurality of power supply wirings 48 as one example of a wiring, and a plurality of ground wirings 49.

The plurality of element connection terminals 45 are electrically connected to the piezoelectric element 7 through a bonding material (for example, solder etc.) when the plurality of piezoelectric elements 7 are mounted on the suspension board with circuit 1. The plurality of element connection terminals 45 are, specifically, the four element connection terminals 45. The two element connection terminals 45 are disposed in each second mounting region 1B. Although in the present embodiment, the number of the element connection terminals 45 is four for convenience, it is not particularly limited.

The plurality of element connection terminals 45 disposed in each second mounting region 1B include a first element connection terminal 45A and a second element connection terminal 45B. In other words, the first element connection terminal 45A as one example of a first terminal and the second element connection terminal 45B are disposed in the second mounting region 1B. The first element connection terminal 45A and the second element connection terminal 45B may be disposed adjacent to the second mounting region 1B.

The first element connection terminal 45A is located in the other end portion of the second mounting region 1B in the longitudinal direction. The first element connection terminal 45A is located on the other end portion of the second stage base 35 in the longitudinal direction. The second element connection terminal 45B is located in one end portion of the second mounting region 1B in the longitudinal direction. The second element connection terminal 45B is located spaced apart from the first element connection terminal 45A at one side in the longitudinal direction. The second element connection terminal 45B is located on the other end portion of the first stage base 34 in the longitudinal direction.

The plurality of power supply terminals 47 are electrically connected to an external power supply which is not shown in a state where the body portion 21 is supported by a load beam (not shown).

The plurality of power supply terminals 47 are located in the other end portion of the suspension board with circuit 1 in the longitudinal direction. The plurality of power supply terminals 47 are located away from the first element connection terminal 45A in the longitudinal direction. The same number of the power supply terminals 47 is provided as the first element connection terminals 45A. The plurality of power supply terminals 47 are located spaced apart from each other in the width direction. The plurality of power supply terminals 47 include a first power supply terminal 47A and a second power supply terminal 47B. The first power supply terminal 47A is located at one side in the width direction, and the second power supply terminal 47B is located at the other side in the width direction. The first power supply terminal 47A is located at the other side of the first external connection terminal 43A in the width direction. The first power supply terminal 47A is disposed on the other end portion of the first supported portion 31B in the longitudinal direction. The second power supply terminal 47B is located at one side of the second external connection terminal 43B in the width direction. The second power supply terminal 47B is disposed on the other end portion of the second supported portion 32B in the longitudinal direction.

The plurality of power supply wirings 48 include a first power supply wiring 48A and a second power supply wiring 48B. The first power supply wiring 48A and the second power supply wiring 48B are disposed spaced apart from each other in the width direction. The first power supply wiring 48A is located at one side in the width direction, and the second power supply wiring 48B is located at the other side in the width direction.

The first power supply wiring 48A includes a first wiring body 48C as one example of a wiring body, and a first reinforcing wiring 48D as one example of a metal member. In other words, the first reinforcing wiring 48D is a portion of the conductive layer 4, and is made of the same metal as the conductive layer 4.

The first wiring body 48C electrically connects the first element connection terminal 45A disposed at one side in the width direction of the two first element connection terminals 45A to the first power supply terminal 47A. The first wiring body 48C passes on the second stage base 35 and on the first body base 31 in order continuously from the first element connection terminal 45A, and is connected to the first power supply terminal 47A. The first wiring body 48C is located at the other side in the width direction with respect to the first signal wiring 44A on the first non-supported portion 31A.

The first reinforcing wiring 48D is disposed on one surface of the connection portion 33 in the thickness direction. The first reinforcing wiring 48D extends in the width direction. The first reinforcing wiring 48D branches so as to be continuous from the first wiring body 48C located on the first non-supported portion 31A, and extends toward the other side in the width direction. One end portion of the first reinforcing wiring 48D in the width direction is located on the first non-supported portion 31A, and is connected to the first wiring body 48C. The other end portion of the first reinforcing wiring 48D in the width direction is a free end portion, that is, located on the second non-supported portion 32A, and is disposed spaced apart from a second wiring body 48E to be described later.

The second power supply wiring 48B includes the second wiring body 48E as one example of a wiring body, and a second reinforcing wiring 48F as one example of a metal member. In other words, the second reinforcing wiring 48F is a portion of the conductive layer 4, and is made of the same metal as the conductive layer 4.

The second wiring body 48E electrically connects the first element connection terminal 45A disposed at the other side in the width direction of the two first element connection terminals 45A to the second power supply terminal 47B. The second wiring body 48E passes on the second stage base 35 and on the second body base 32 in order continuously from the first element connection terminal 45A, and is connected to the second power supply terminal 47B. The second wiring body 48E is located at one side in the width direction with respect to the second signal wiring 44B on the second non-supported portion 32A.

The second reinforcing wiring 48F is disposed on one surface of the connection portion 33 in the thickness direction. The second reinforcing wiring 48F is located in parallel and spaced apart from the first reinforcing wiring 48D at one side in the longitudinal direction. The second reinforcing wiring 48F extends in the width direction. The second reinforcing wiring 48F branches so as to be continuous from the second wiring body 48E located on the second non-supported portion 32A, and extends toward one side in the width direction. The other end portion of the second reinforcing wiring 48F in the width direction is located on the second non-supported portion 32A, and is connected to the second wiring body 48E. One end portion of the second reinforcing wiring 48F in the width direction is a free end portion, that is, located on the first non-supported portion 31A, and is disposed spaced apart from the first wiring body 48C.

The ground wiring 49 is connected to the second element connection terminal 45B, and the second element connection terminal 45B and the first stage 26 are electrically connected (grounded). The plurality of ground wirings 49 are located spaced apart from each other in the width direction. The ground wiring 49 extends from the second element connection terminal 45B toward one side in the longitudinal direction. The ground wiring 49 is brought into contact with (is grounded to) the first stage 26 through a hole, which is not shown, provided in the first stage base 34.

Examples of a material for the conductive layer 4 include conductive materials such as copper. A thickness of the conductive layer 4 is, for example, 1 μm or more, preferably 3 μm or more, and for example, 20 μm or less, preferably 12 μm or less.

1-4. Cover Insulating Layer

Figure 3:
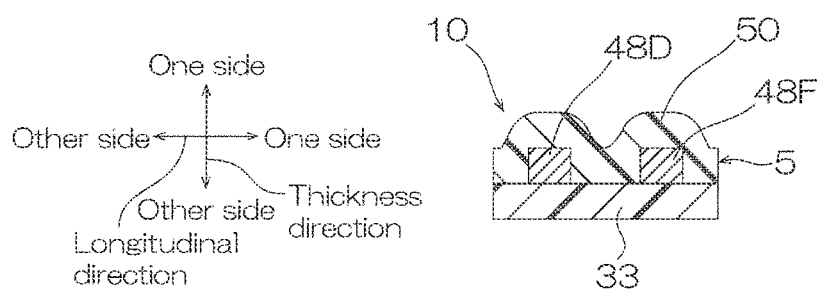
FIG. 3 shows a B-B cross-sectional view of the suspension board with circuit shown in FIG. 1.

As shown in FIGS. 2 and 3, the cover insulating layer 5 is disposed on one side in the thickness direction of the base insulating layer 3 so as to cover the conductive layer 4, specifically, on one surface in the thickness direction of the base insulating layer 3.

The cover insulating layer 5 covers the first wiring pattern 40 so as to expose the plurality of slider connection terminals 42 and the plurality of external connection terminals 43. Further, the cover insulating layer 5 covers the second wiring pattern 41 so as to expose the plurality of element connection terminals 45 and the plurality of power supply terminals 47. Thus, as shown in FIG. 3, the cover insulating layer 5 covers the first reinforcing wiring 48D and the second reinforcing wiring 48F.

Specifically, the cover insulating layer 5 has a reinforcing cover 50. The reinforcing cover 50 is disposed on one surface in the thickness direction of the connection portion 33 so as to cover the first reinforcing wiring 48D and the second reinforcing wiring 48F.

Examples of a material for the cover insulating layer 5 include synthetic resins such as polyimide resins. A thickness of the cover insulating layer 5 is, for example, 1 μm or more, preferably 2 μm or more, and for example, 10 μm or less, preferably 8 μm or less.

1-5. Reinforcing Portion

The suspension board with circuit 1 includes a reinforcing portion 10. The reinforcing portion 10 reinforces the connection portion 33. The reinforcing portion 10 is disposed on the surface of the connection portion 33. More specifically, the reinforcing portion 10 is disposed on one surface of the connection portion 33 in the thickness direction.

In the present embodiment, the reinforcing portion 10 includes the above-described first reinforcing wiring 48D, the above-described second reinforcing wiring 48F, and the above-described reinforcing cover 50.

As shown in FIGS. 1 and 3, in the suspension board with circuit 1, the base insulating layer 3 includes the connection portion 33 which connects a portion of the first non-supported portion 31A to a portion of the second non-supported portion 32A, and the reinforcing portion 10 is disposed on the surface of the connection portion 33. Then, the reinforcing portion 10 includes the first reinforcing wiring 48D and the second reinforcing wiring 48F. Therefore, it is possible to sufficiently reinforce the connection portion 33.

However, the suspension board with circuit 1 is mounted on a hard disk drive which is not shown in a state where the slider 6 and the piezoelectric element 7 are mounted. Then, the suspension board with circuit 1 supports a magnetic head of the slider 6 while maintaining a minute interval with a magnetic disk against the air flow when the magnetic head and the magnetic disk relatively run. At this time, if necessary, the piezoelectric element 7 is extended and contracted by supplying electricity to the piezoelectric element 7, and by moving the stage 23 up and down with respect to the magnetic disk, the slider 6 may be displaced.

In this case, the first non-supported portion 31A and the second non-supported portion 32A are deformed following the movement of the stage 23. Thus, there is a possibility that load stress acts on the connection portion 33.

However, in the suspension board with circuit 1, since the connection portion 33 is sufficiently reinforced by the reinforcement portion 10, it is possible to suppress damage to the connection portion 33, and stably control the deformation of the suspension board with circuit 1.

Further, the first reinforcing wiring 48D and the second reinforcing wiring 48F are a portion of the conductive layer 4, and are made of the same metal as the conductive layer 4. Therefore, in the production of the suspension board with circuit 1, it is possible to collectively form the conductive layer 4 including the first reinforcing wiring 48D and the second reinforcing wiring 48F in the above-described pattern by, for example, an additive method or a subtractive method.

The first power supply wiring 48A includes the first wiring body 48C and the first reinforcing wiring 48D, and the second power supply wiring 48B includes the second wiring body 48E and the second reinforcing wiring 48F. Therefore, it is possible to dispose the first reinforcing wiring 48D and the second reinforcing wiring 48F on the connection portion 33, while ensuring efficient routing of the first wiring body 48C and the second wiring body 48E. Further, it is possible to collectively inspect formation failure of the first wiring body 48C and the second wiring body 48E, and formation failure of the first reinforcing wiring 48D and the second reinforcing wiring 48F by conduction inspection of the power supply wiring 48.

MODIFIED EXAMPLES

In the above-described embodiment, the power supply wiring 48 includes the reinforcing wiring (the first reinforcing wiring 48D, the second reinforcing wiring 48F) as one example of a metal member. However, the wiring including the metal member is not limited to this. The wiring including the metal member may be a signal wiring, a ground wiring which is electrically connected to the metal supporting layer 2, or a dummy wiring which is not connected to a terminal.

In the above-described embodiment, the first power supply wiring 48A includes the first wiring body 48C and the first reinforcing wiring 48D. However, the wiring of the present invention is not limited to this.

Figure 4:
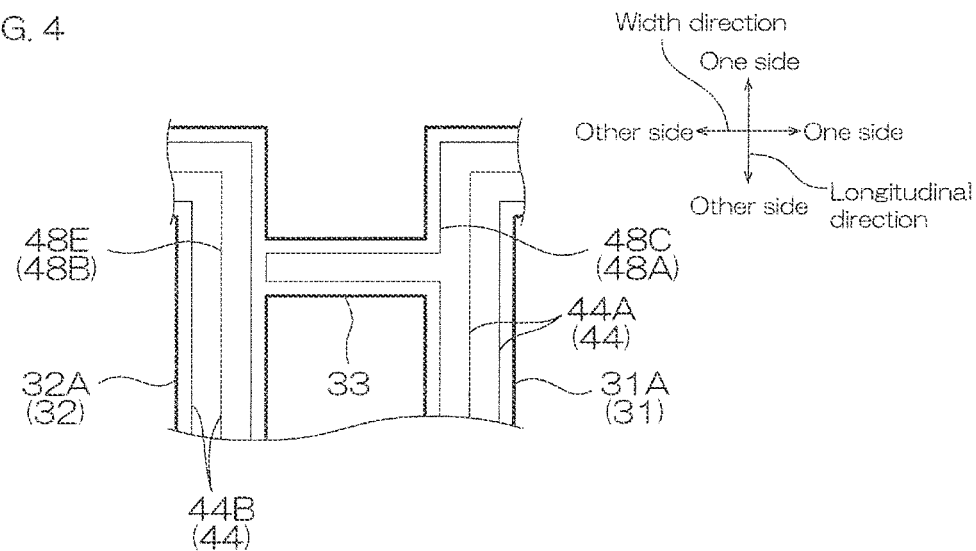
FIG. 4 shows a first modified example (embodiment in which a first wiring body is routed on a connection portion) of a reinforcing portion shown in FIG. 1.

As shown in FIG. 4, the first power supply wiring 48A may consist of the first wiring body 48C without including the first reinforcing wiring 48D. In this case, the first wiring body 48C is routed in a U-shape so as to pass on the connection portion 33. A portion located on the connection portion 33 in the first wiring body 48C corresponds to the metal member.

Figure 5:
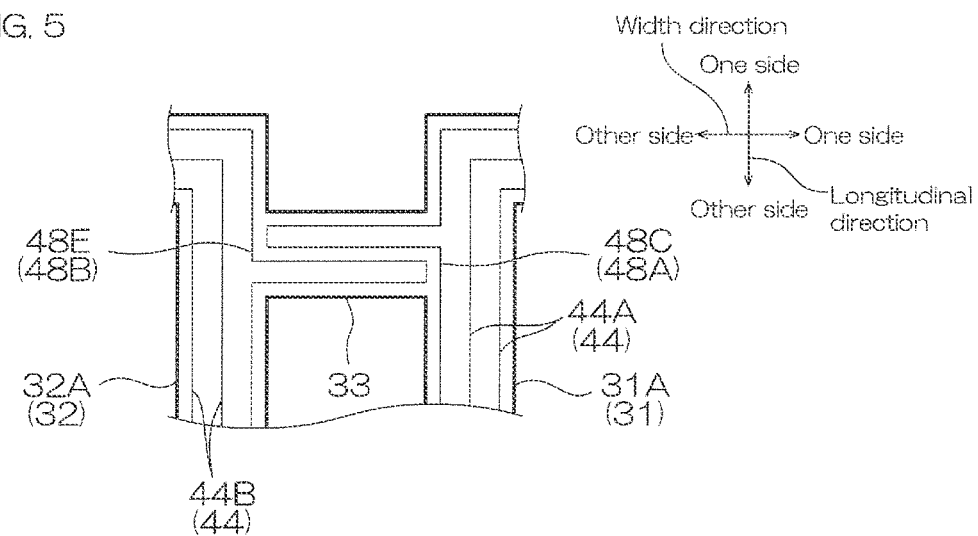
FIG. 5 shows a second modified example (embodiment in which a first wiring body and a second wiring body are routed on a connection portion) of a reinforcing portion shown in FIG. 1.
Figure 6:
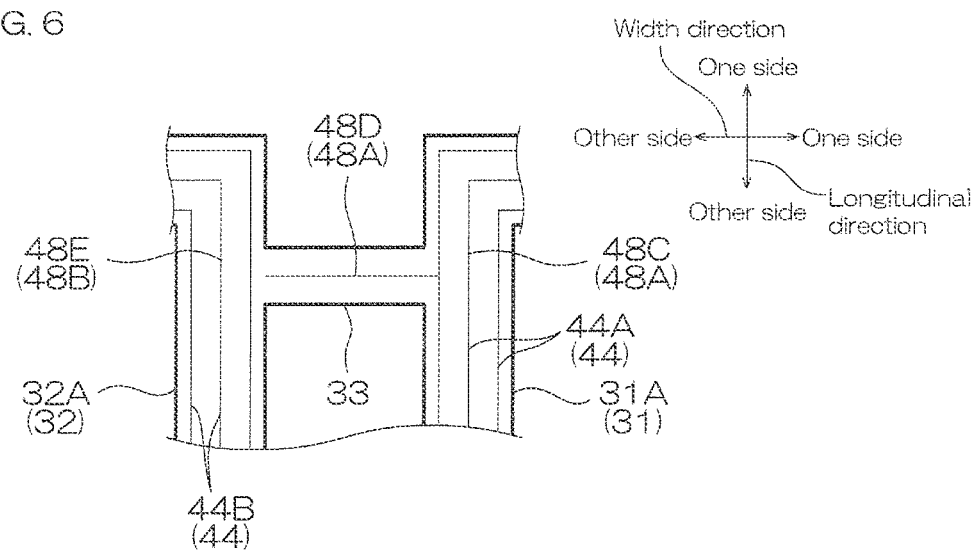
FIG. 6 shows a third modified example (embodiment in which a first power supply wiring includes a first reinforcing wiring and a second power supply wiring does not include a second reinforcing wiring) of a reinforcing portion shown in FIG. 1.

As shown in FIGS. 4 to 6, the second power supply wiring 48B may consist of the second wiring body 48E without including the second reinforcing wiring 48F. When the first power supply wiring 48A includes a metal member located on the connection portion 33, the second wiring body 48E may not be routed on the connection portion 33 (ref: FIGS. 4 and 6), and may be routed on the connection portion 33 (ref: FIG. 5).

Figure 7:
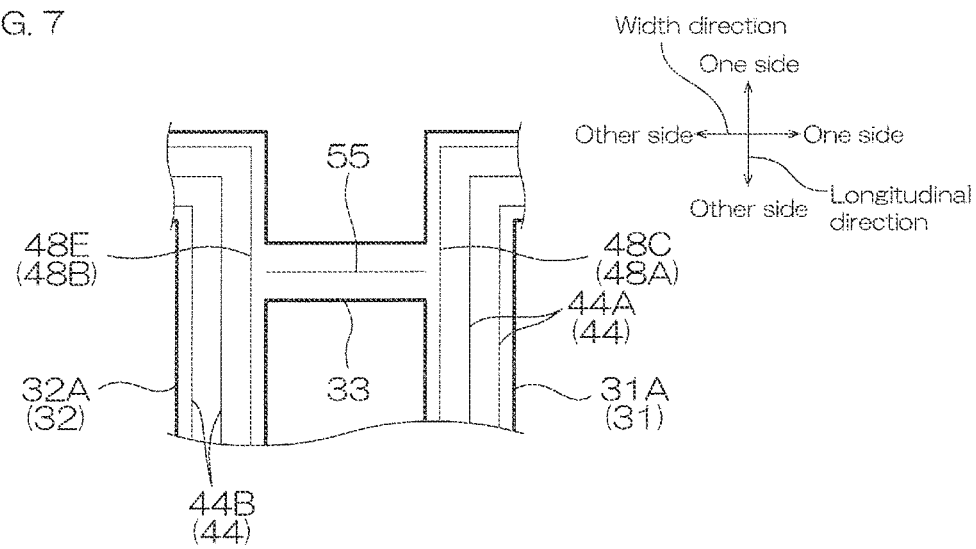
FIG. 7 shows a fourth modified example (embodiment in which a dummy wiring is disposed on a connection portion) of a reinforcing portion shown in FIG. 1.

As shown in FIG. 7, a dummy wiring 55 as one example of a metal member may be disposed on the connection portion 33 instead of the first reinforcing wiring 48D. The dummy wiring 55 is not connected to the first wiring body 48C and the second wiring body 48E. In the embodiment shown in FIG. 7, it is difficult to form a pattern of the conductive layer 4 as compared with the above-described embodiment. Therefore, the above-described embodiment is more preferable.

Figure 8:
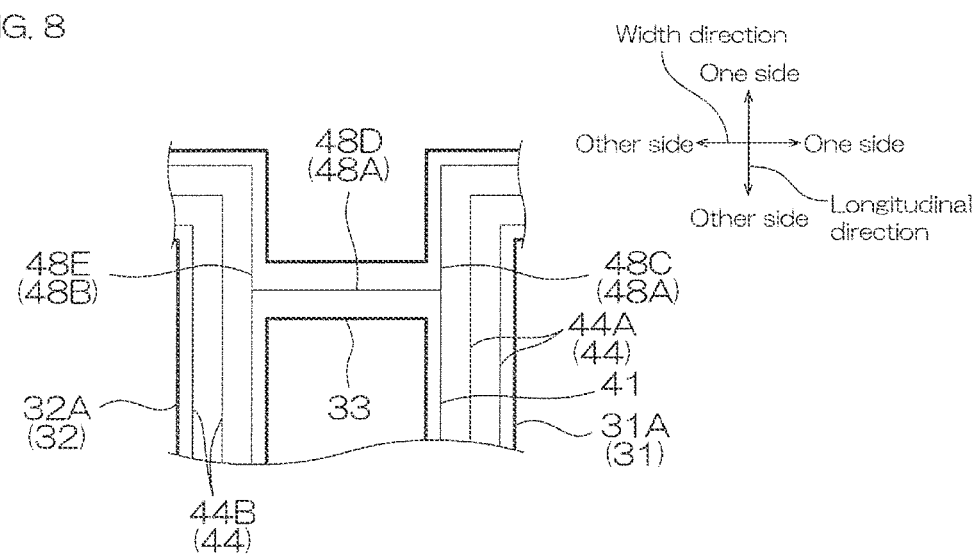
FIG. 8 shows a fifth modified example (embodiment in which a first reinforcing wiring is connected to a first wiring body and a second wiring body) of a reinforcing portion shown in FIG. 1.

As shown in FIG. 8, the first reinforcing wiring 48D may be connected to the first wiring body 48C and the second wiring body 48E. In this case, each of the first wiring body 48C and the second wiring body 48E is a circuit which allows conduction, or a dummy wiring.

Figure 9A:
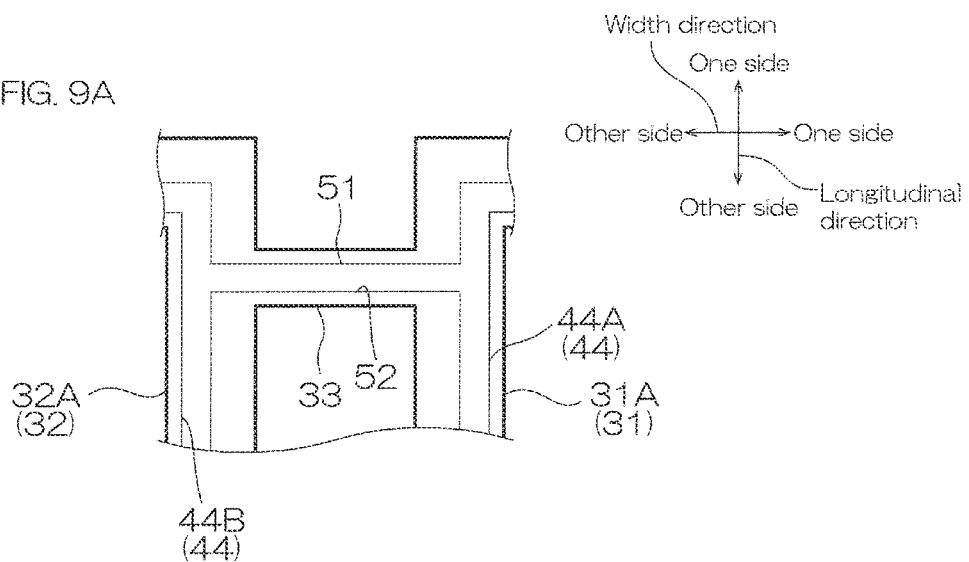
FIG. 9A shows a sixth modified example (embodiment in which a conductive layer includes a first wiring and a second wiring) of a reinforcing portion shown in FIG. 1.
Figure 9B:
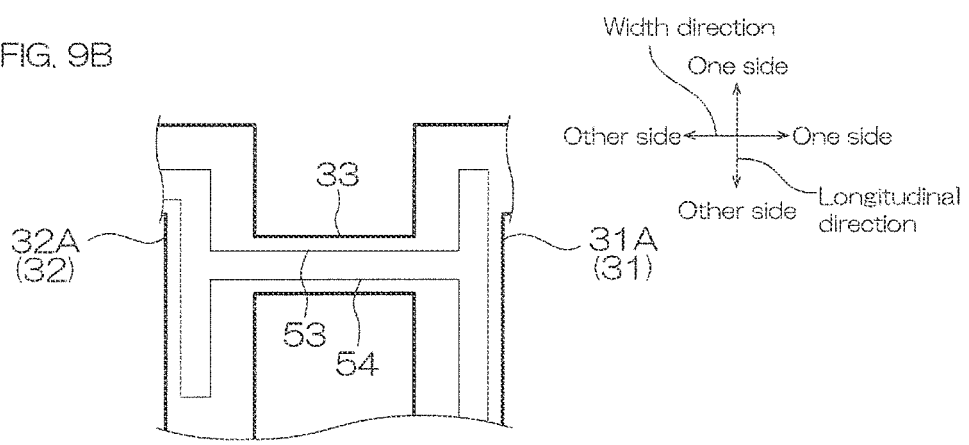
FIG. 9B shows a seventh modified example (embodiment in which a conductive layer includes a third wiring and a fourth wiring) of a reinforcing portion shown in FIG. 1.

Further, as shown in FIGS. 9A and 9B, the routing of the wiring including the metal member is not particularly limited as long as the routing is carried out so as to pass on the connection portion 33.

As shown in FIG. 9A, the first wiring 51 extends toward the other side in the longitudinal direction on the first non-supported portion 31A, thereafter, is bent toward the other side in the width direction to be routed so as to pass on the connection portion 33, and then, is bent toward one side in the longitudinal direction on the second non-supported portion 32A. A portion located on the connection portion 33 in the first wiring 51 corresponds to the metal member.

The second wiring 52 is located at the other side with respect to the first wiring 51 in the longitudinal direction. The second wiring 52 extends toward one side in the longitudinal direction on the first non-supported portion 31A, thereafter, is bent toward the other side in the width direction to be routed so as to pass on the connection portion 33, and next, is bent toward the other side in the longitudinal direction on the second non-supported portion 32A. A portion located on the connection portion 33 in the second wiring 52 corresponds to the metal member.

Further, as shown in FIG. 9B, the third wiring 53 extends toward the other side in the longitudinal direction on the second non-supported portion 32A, next, is bent toward one side in the width direction to be routed so as to pass on the connection portion 33, and next, is bent to make a U-turn on the second non-supported portion 32A to extend toward the other side in the longitudinal direction. A portion located on the connection portion 33 in the third wiring 53 corresponds to the metal member.

The fourth wiring 54 extends toward the other side in the longitudinal direction on the second non-supported portion 32A, thereafter, extends to make a U-turn, next, is bent toward one side in the width direction to be routed so as to pass on the connection portion 33, and next, is bent toward the other side in the longitudinal direction on the first non-supported portion 31A. A portion located on the connection portion 33 in the fourth wiring 54 corresponds to the metal member.

Figure 10:
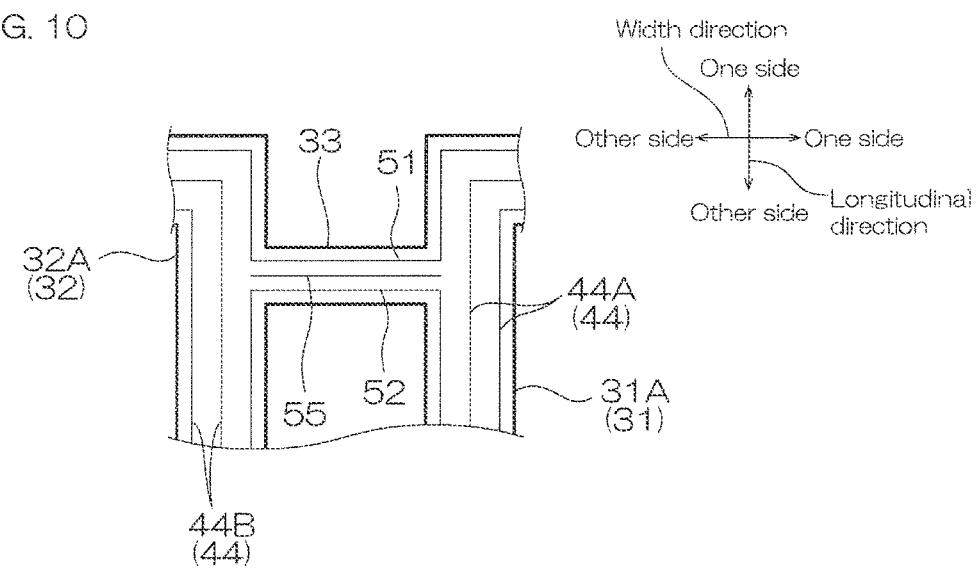
FIG. 10 shows a seventh modified example (embodiment in which a conductive layer includes a first reinforcing wiring, a first wiring, and a second wiring) of a reinforcing portion shown in FIG. 1.

Further, as shown in FIG. 10, in the embodiment of FIG. 9A, the conductive layer 4 may include the dummy wiring 55 in addition to the first wiring 51 and the second wiring 52. The dummy wiring 55 is located between the first wiring 51 and the second wiring 52 on the connection portion 33.

Figure 11:
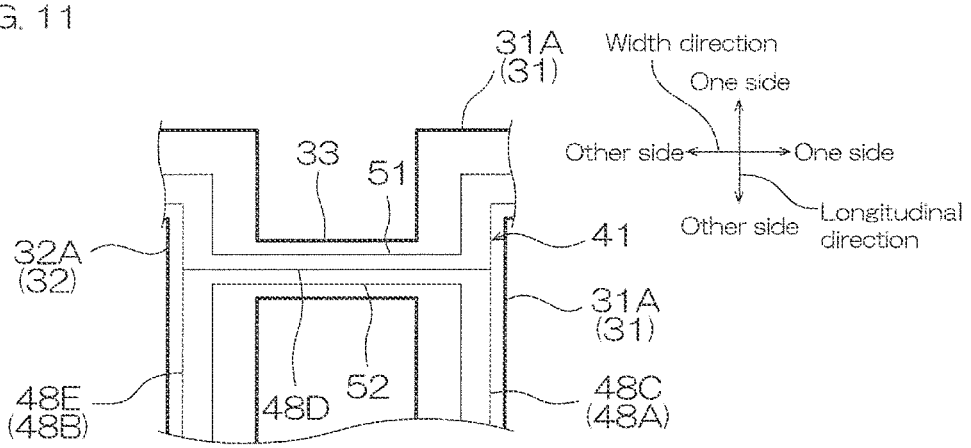
FIG. 11 shows an eighth modified example (embodiment in which a conductive layer includes a second wiring pattern, a first wiring, and a second wiring) of a reinforcing portion shown in FIG. 1.

Further, as shown in FIG. 11, in the embodiment of FIG. 8, when the first wiring body 48C and the second wiring body 48E are the dummy wirings, the conductive layer 4 may include the first wiring 51 and the second wiring 52 in addition to the second wiring pattern 41.

Figure 12A:
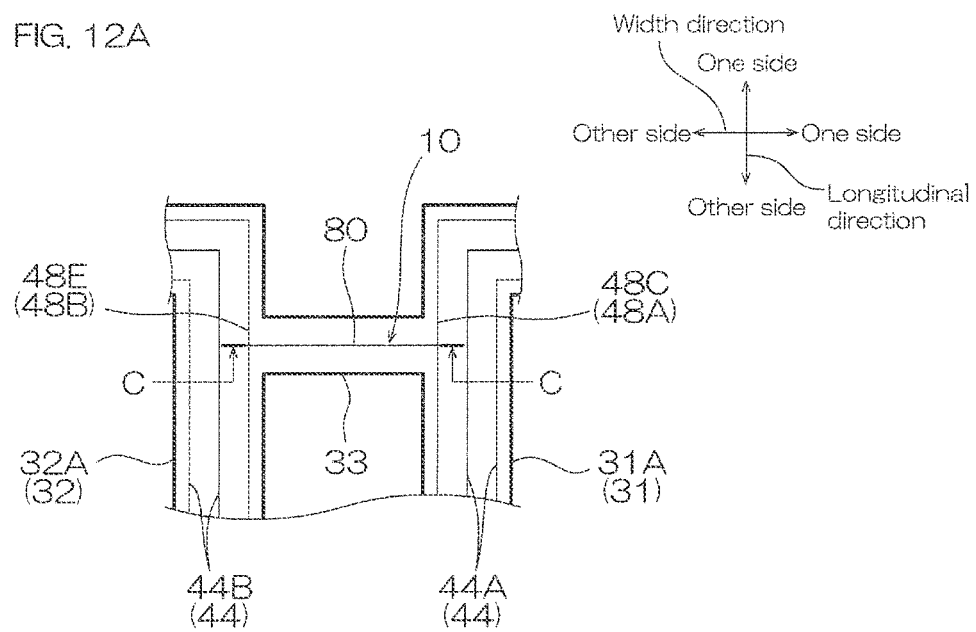
FIG. 12A shows a ninth modified example (embodiment in which a suspension board with circuit includes a second conductive layer and a second cover insulating layer) of a reinforcing portion shown in FIG. 1.
Figure 12B:
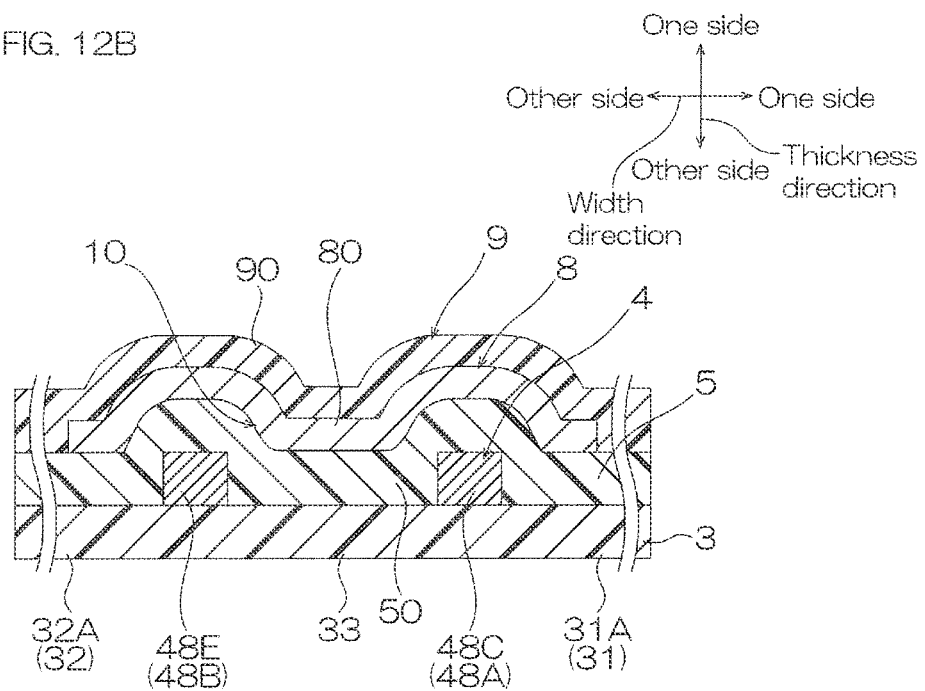
FIG. 12B shows a C-C cross-sectional view of the reinforcing portion shown in FIG. 12A.

Further, as shown in FIGS. 12A and 12B, the suspension board with circuit 1 may further include a second conductive layer 8 and a second cover insulating layer 9 in addition to the metal supporting layer 2 (ref: FIG. 2), the base insulating layer 3, the conductive layer 4, and the cover insulating layer 5.

The second conductive layer 8 is disposed on one side of the cover insulating layer 5 in the thickness direction, specifically, on one surface in the thickness direction of the cover insulating layer 5. The second conductive layer 8 includes a reinforcing wiring 80 as one example of a metal member.

The reinforcing wiring 80 extends in the width direction. The reinforcing wiring 80 is disposed so as to be collectively overlapped with the first wiring body 48C, the connection portion 33, and the second wiring body 48E when viewed in the thickness direction.

The second cover insulating layer 9 is disposed on one side in the thickness direction of the cover insulating layer 5 so as to cover the second conducive layer 8, specifically, on one surface in the thickness direction of the cover insulating layer 5. The second cover insulating layer 9 has a second reinforcing cover 90. The second reinforcing cover 90 is disposed on one surface in the thickness direction of the reinforcing cover 50 so as to cover the reinforcing wiring 80.

As shown in FIG. 12B, in the modified example, the reinforcing portion 10 includes the above-described reinforcing cover 50, the above-described reinforcing wiring 80, and the above-described second reinforcing cover 90. In other words, the reinforcing portion 10 includes the reinforcing cover 50 and the second reinforcing cover 90 as two resin layers laminated in the thickness direction, and the reinforcing wiring 80 as a metal member.

Figure 13A:
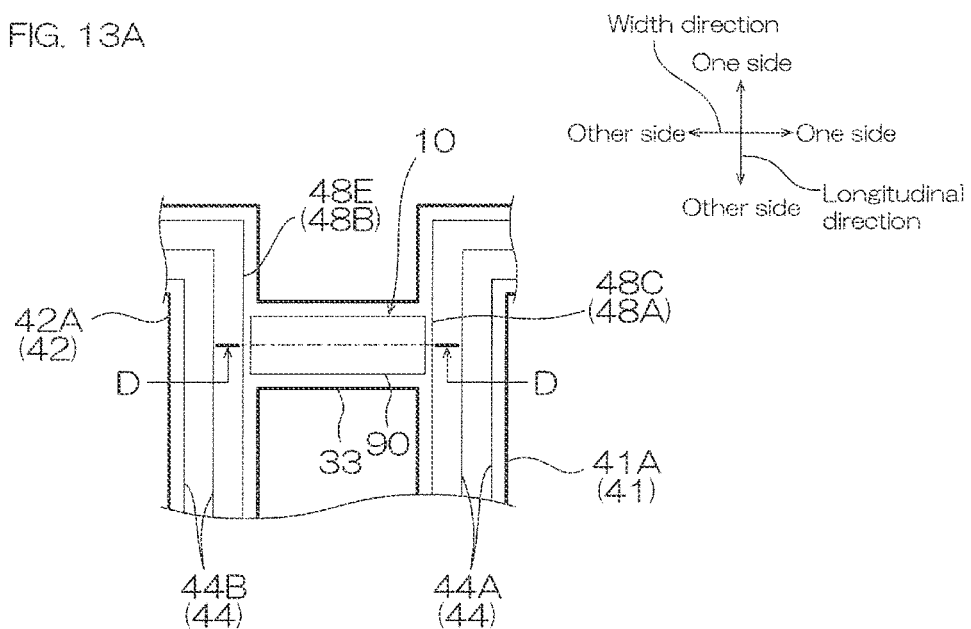
FIG. 13A shows a tenth modified example (embodiment in which a reinforcing portion consists of two resin layers, and a second reinforcing cover is located between a first wiring body and a second wiring body) of a reinforcing portion shown in FIG. 1.
Figure 13B:
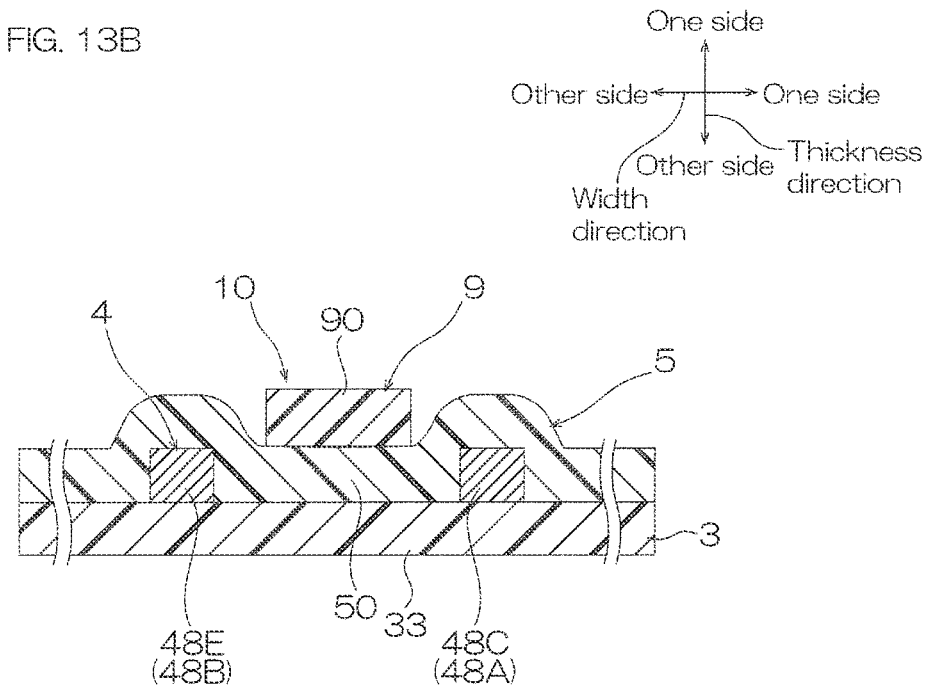
FIG. 13B shows a D-D cross-sectional view of the reinforcing portion shown in FIG. 13A.

Further, as shown in FIGS. 13A and 13B, the reinforcing portion 10 may consist of two or more resin layers laminated in the thickness direction. As shown in FIG. 13B, in the modified example, the reinforcing portion 10 consists of the reinforcing cover 50 and the second reinforcing cover 90. In the modified example, the second reinforcing cover 90 is located between the first wiring body 48C and the second wiring body 48E in the width direction.

Further, though not shown, the reinforcing portion 10 may include the first reinforcing wiring 48D and/or the second reinforcing wiring 48F in addition to the reinforcing cover 50 and the second reinforcing cover 90. In this case, the second reinforcing cover 90 is overlapped with the first reinforcing wiring 48D and/or the second reinforcing wiring 48F when viewed in the thickness direction.

Figure 14:
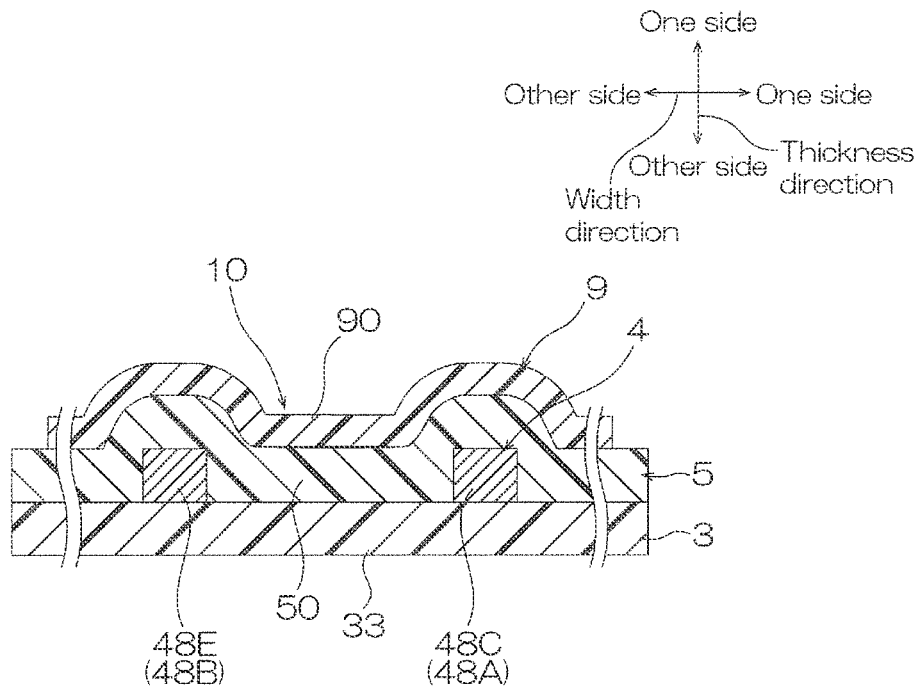
FIG. 14 shows an eleventh modified example (embodiment in which a reinforcing portion consists of two resin layers, and a second reinforcing cover is overlapped with a first wiring body and a second wiring body when viewed in a thickness direction) of the reinforcing portion shown in FIG. 1.

Further, as shown in FIG. 14, the dimension of the second reinforcing cover 90 in the width direction is not particularly limited, and the second reinforcing cover 90 may be disposed so as to be collectively overlapped with the first wiring body 48C, the connection portion 33, and the second wiring body 48E when viewed in the thickness direction. According to the modified example, as compared with the embodiment shown in FIGS. 13A and 13B, it is possible to suppress the damage to the reinforcing portion 10.

Figure 15:
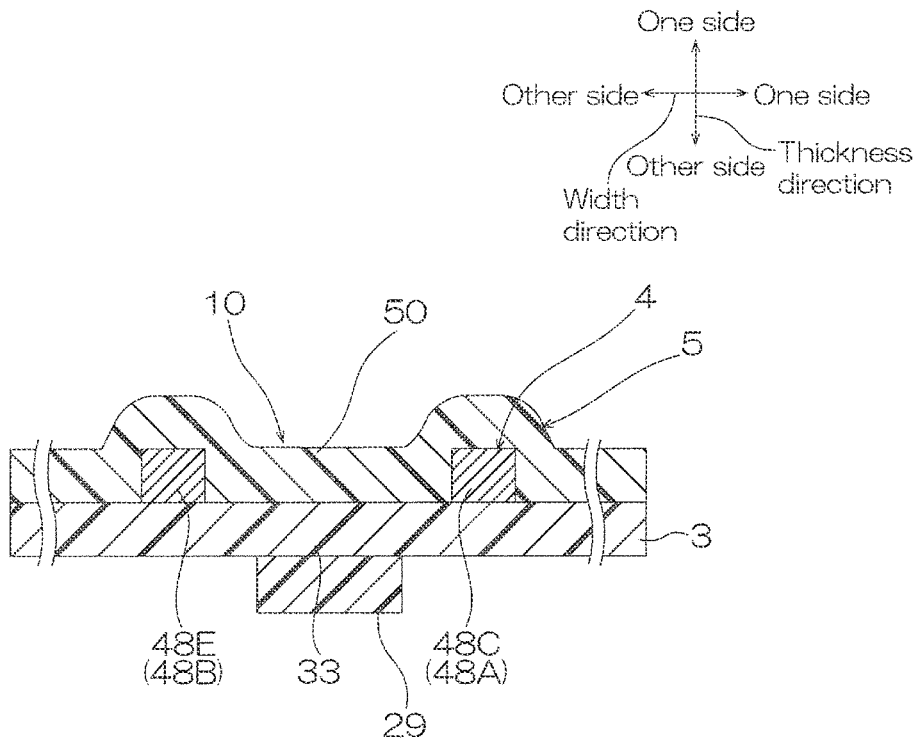
FIG. 15 shows a twelfth modified example (embodiment in which a reinforcing portion includes a reinforcing support) of a reinforcing portion shown in FIG. 1.

Further, as shown in FIG. 15, the reinforcing portion 10 may also include a reinforcing support 29 made of the same metal as the metal supporting layer 2. The reinforcing support 29 is disposed on the other surface of the connection portion 33 in the thickness direction.

Figure 16:
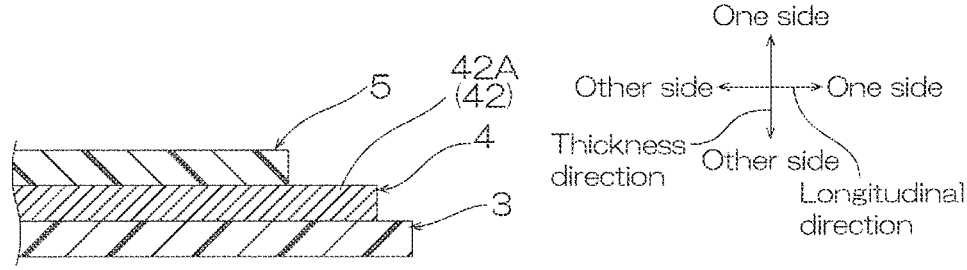
FIG. 16 shows a flexible printed wiring board as another embodiment of the wiring circuit board shown in FIG. 1.

In the above-described embodiment, the suspension board with circuit 1 is used as one example of a wiring circuit board. However, the wiring circuit board is not limited to the suspension board with circuit 1. As shown in FIG. 16, the wiring circuit board may be a flexible printed wiring board 100 without including the metal supporting layer 2.

Each modified example can achieve the same function and effect as that of the above-described embodiment. Furthermore, the embodiments and the modified examples can be appropriately used in combination.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The wiring circuit board of the present invention is, for example, preferably used for various applications such as flexible printed wiring boards, flexible printed wiring boards with a reinforcing layer including a reinforcing layer, and suspension boards with circuit including a suspension (spring) layer.

DESCRIPTION OF REFERENCE NUMERALS

1 Suspension board with circuit
10 Reinforcing portion
3 Base insulating layer
31 First body base
32 Second body base
33 Connection portion
4 Conductive layer
45 Element connection terminal
47 Power supply terminal
48 Power supply wiring
48C First wiring body
48D First reinforcing wiring
48E Second wiring body
48F Second reinforcing wiring

The invention claimed is:

1. A wiring circuit board extending in a predetermined direction comprising:
   an insulating layer, and
   a conductive layer disposed on one side in a thickness direction of the insulating layer, wherein the insulating layer includes:
      a first portion and a second portion disposed spaced apart from each other in a width direction perpendicular to a longitudinal direction of the wiring circuit board, and
      a connection portion connecting a portion of the first portion in the longitudinal direction to a portion of the second portion in the longitudinal direction;
   wherein the wiring circuit board includes a reinforcing portion disposed on the surface of the connection portion and reinforcing the connection portion; and
   wherein the reinforcing portion includes two or more layers laminated in the thickness direction, and the two or more layers include at least one of a resin layer and a metal member.

2. The wiring circuit board according to claim 1, wherein the reinforcing portion includes the metal member, and the metal member is made of the same metal as the conductive layer.

3. The wiring circuit board according to claim 2, wherein the conductive layer includes a wiring, and the wiring includes the metal member.

4. The wiring circuit board according to claim 3, wherein the conductive layer includes a first terminal, and a second terminal located away from the first terminal in the longitudinal direction, and
   the wiring includes a wiring body connecting the first terminal to the second terminal, and
the metal member continuous with the wiring body.

* * * * *